United States Patent
Mannarino

(10) Patent No.: US 9,821,723 B2
(45) Date of Patent: Nov. 21, 2017

(54) HEIGHT ADJUSTABLE HOLDER FOR MOBILE DEVICE

(71) Applicant: Faurecia Interieur Industrie, Nanterre (FR)

(72) Inventor: Mickaël Mannarino, Rouen (FR)

(73) Assignee: Faurecia Interieur Industrie, Nanterre (FR)

( * ) Notice: Subject to any disclaimer, the term of this patent is extended or adjusted under 35 U.S.C. 154(b) by 213 days.

(21) Appl. No.: 14/528,741

(22) Filed: Oct. 30, 2014

(65) Prior Publication Data

US 2015/0151690 A1    Jun. 4, 2015

(30) Foreign Application Priority Data

Oct. 30, 2013  (FR) ...................... 13 60632

(51) Int. Cl.
| | |
|---|---|
| *B60R 11/02* | (2006.01) |
| *F16M 11/04* | (2006.01) |
| *F16M 13/00* | (2006.01) |
| *H05K 5/02* | (2006.01) |
| *B60R 11/00* | (2006.01) |

(52) U.S. Cl.
CPC .......... *B60R 11/02* (2013.01); *F16M 11/041* (2013.01); *F16M 13/00* (2013.01); *H05K 5/0204* (2013.01); *B60R 2011/0005* (2013.01); *B60R 2011/0075* (2013.01)

(58) Field of Classification Search
CPC .. B60R 7/05; B60R 7/06; B60R 11/00; B60R 2011/0064; B60R 2011/0075; B60R 2011/0005; B60R 2011/71; B60R 11/241
USPC ....................................................... 224/245
See application file for complete search history.

(56) References Cited

U.S. PATENT DOCUMENTS 5,457,745 A * 10/1995 Wang .................. B60R 11/0241
                                                                  379/426
5,471,530 A * 11/1995 Chen .................. B60R 11/0241
                                                                  379/426

(Continued)

FOREIGN PATENT DOCUMENTS

DE    102011054346 B3    4/2013
WO    WO2010018011 A1    2/2010

OTHER PUBLICATIONS

Search Report for application No. FR 1360632, dated Jul. 28, 2014, 7 pages—not translated.

*Primary Examiner* — Justin Larson
*Assistant Examiner* — Phillip Schmidt
(74) *Attorney, Agent, or Firm* — Reising Ethington P.C.

(57) ABSTRACT

A mobile device holder having a front face, an integral fixed jaw, and a movable jaw positioned facing the fixed jaw and movable in translational motion on the front face. The movable jaw receives a bottom edge of the mobile device and can be moved between a released position for inserting or removing the mobile device, and a holding position in which the mobile device is held clamped against the fixed jaw. The movable jaw includes a protuberance extending along a plane parallel to the front face of the holder and defining a clamping tab for clamping the bottom edge of the mobile device. In use, the tab maintains a space between the rear face of the mobile device and the front face of the holder in order to limit the frictional contact of the rear face of the mobile device with the front face of the holder when mounted.

14 Claims, 3 Drawing Sheets

(56) References Cited

U.S. PATENT DOCUMENTS

| | | | |
|---|---|---|---|
| 6,491,194 B2 * | 12/2002 | Marvin | B60R 11/0241 |
| | | | 224/247 |
| 2003/0083115 A1 * | 5/2003 | Kato | H04B 1/3877 |
| | | | 455/573 |
| 2009/0060473 A1 * | 3/2009 | Kohte | F16M 11/041 |
| | | | 386/200 |
| 2011/0255226 A1 * | 10/2011 | Duncan Seil | B60R 11/02 |
| | | | 361/679.01 |
| 2012/0257346 A1 * | 10/2012 | Hulet | H04M 1/04 |
| | | | 361/679.32 |
| 2013/0050932 A1 | 2/2013 | Williams | |
| 2016/0257260 A1 * | 9/2016 | Barre | B60R 11/02 |

\* cited by examiner

HEIGHT ADJUSTABLE HOLDER FOR MOBILE DEVICE

TECHNICAL FIELD

The invention relates to a holder for a hand held portable device (also referred to as mobile device) on a holder and, more particularly, relates to a holder for mobile electronic device, such as a Smartphone or a tablet, and to a height adjustable holder for use in a motor vehicle.

BACKGROUND

Known holders include holders of the type comprising a fixed base for receiving the electronic device and a retaining member mounted on the base so to be movable between a released position, wherein the electronic device can be placed on the receiving base, and a holding position wherein the retaining member holds the electronic apparatus in place on the receiving base, the retaining member being mounted so as to allow translational movement relative to the fixed base along a direction of translational movement between the released position and the holding position, unidirectional locking means being arranged so as to allow for translational movement of the retaining member from its released position to its holding position, while also preventing movement of the retaining member from its holding position to its released position.

More and more mobile electronic devices offering a large number of features and functionalities are available to users, and in particular to drivers of motor vehicles.

In particular, device such as mobile phones, especially "Smartphone", "Personal Digital Assistant" or PDA, or geolocating devices, in particular by means of "Global Positioning System" or GPS, help the driver of a motor vehicle in determining a route, to provide him with information on the state of traffic on the roads or to assist him in the operation of his vehicle.

Such devices are controlled, for example by means of a touch screen that should therefore be accessible to the driver without requiring him to take the device in hand while driving the vehicle.

Thus, known technology already allows for providing a holder for the electronic device in close proximity to the driver, for example on the dashboard of the motor vehicle, in order to hold the device in place while leaving the screen unobstructed so as to allow for it to be operated and controlled without having to take the device in one's hands.

Given the diversity of these devices, and in particular their dimensions, it is known to provide an adjustable holder that may be adapted to several different types of devices, and notably to the height thereof.

To this end, the holder generally includes retaining jaws for holding the bottom edge and the top edge of the electronic device; the jaw for holding the top edge being adjustable in height in a manner such as to adapt the holder to the height of the device being received by this holder.

As disclosed in particular in the document FR2974049, the fixed jaw receives the bottom edge and forms a "cradle" as per the current terminology.

In a configuration wherein it is the lower jaw that is movable, it is necessary to provide a means for positioning the bottom edge of the device in a safe and secure manner, so as to be compatible with the manipulation of the device, since in such a configuration, it is no longer the movable jaw, which comes to bear on the device but the device which comes to be supported on the movable jaw, while also protecting the holder and/or the device from possible damage from the introduction of the bottom edge of the device in the cradle.

SUMMARY

In at least some embodiments, the invention provides the ability to manage this configuration by offering a mobile device holder, the positioning of which is secure and simplified by limiting the number of manipulations needed and requiring the use of only one hand.

To this end, at least some embodiments of the invention provide a holder for a mobile device comprising a front face bearing a fixed jaw that is integrally attached to the holder, the said holder further comprising a movable jaw, positioned facing the fixed jaw, mounted to be movable in translational motion on the front face of the holder, characterized in that the movable jaw is adapted to receive a first edge of the mobile device, between a released position, wherein the first edge of the mobile device is placed against the movable jaw, and a holding position in which a second edge of the mobile device, opposite the first is held clamped against the fixed jaw; the said movable jaw comprising at least one protuberance extending along a plane parallel to the front face of the holder and capable of defining a clamping tab for clamping the first edge of the mobile device; the shape and the dimensions of the tab being appropriately established so as to define a determined space between the rear face of the mobile device and the front face of the holder. Thus the presence of the protuberance prevents direct contact between an edge of the mobile device and the front face of the holder.

According to one characteristic feature, the protuberance has one portion arranged in a groove formed on the front face of the holder and movable in translational motion along the said groove. According to one characteristic feature, the clamping tab is formed integrally joined with the movable jaw.

According to another characteristic feature, the front portion of the movable jaw has an opening whose dimensions are determined so as to allow for the through passage of a connector of the mobile device when the first lateral edge of the mobile device is positioned against the clamping tab.

According to one characteristic feature, the opening is of a generally rectangular shape, passing right through the front portion of the movable jaw and centred along the axis of vertical symmetry of the holder; the front surface of the tab being at least partially merged with a part of the wall of the opening.

According to another characteristic feature, the front surface of the tab defines a guide surface capable of guiding the first lateral edge of the mobile device.

According to another characteristic feature, the movable jaw is the lower jaw when considering the holder oriented in its position of use; the said movable jaw being capable of cooperating with the bottom edge of the mobile device.

Finally a further object of the invention relates to a dashboard of a motor vehicle, characterized in that it includes a holder as described here above.

BRIEF DESCRIPTION OF THE DRAWINGS

Other aspects and advantages of the invention will become apparent upon reading the description that follows, given purely by way of example and with reference being made to the accompanying drawings in which.

DETAILED DESCRIPTION OF THE ILLUSTRATED EMBODIMENT(S)

Figure 1:
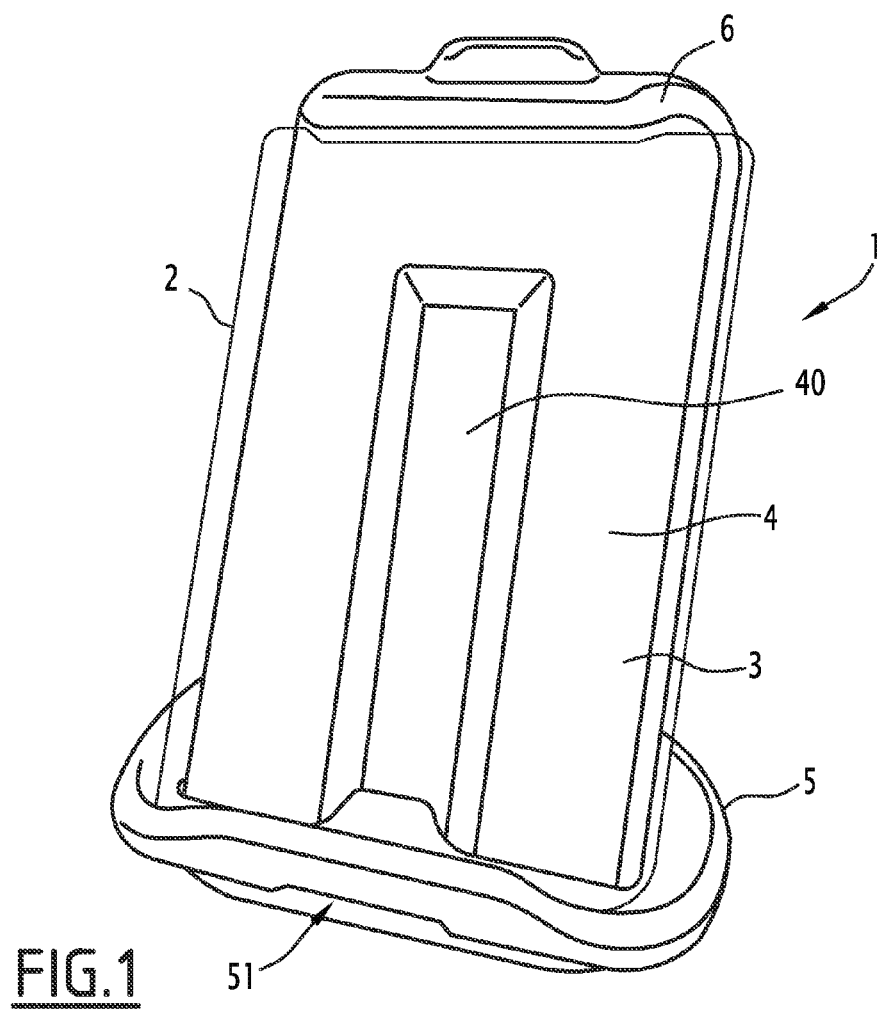
FIG. 1 is a perspective view of a holder for a Smartphone equipped with a clamping system according to the invention.
Figure 2:
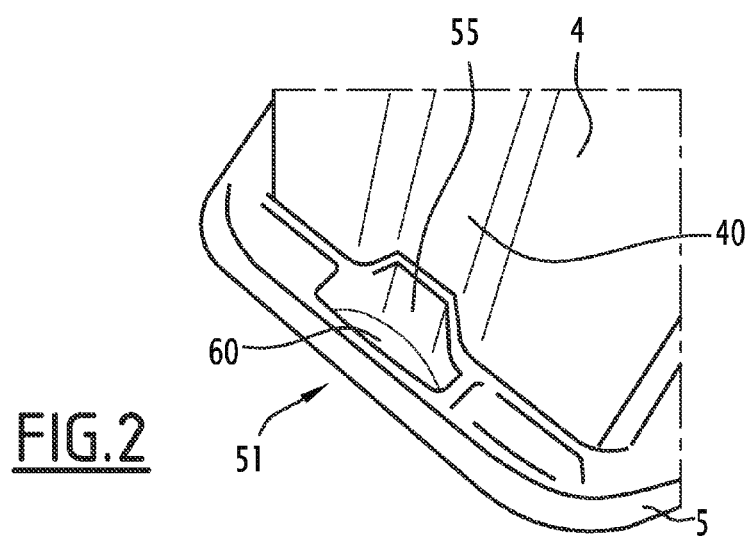
FIG. 2 is a view of a detail represented in FIG. 1 revealing the opening for through passage of the connector of the Smartphone.

In the figures, identical elements are designated by the same identifying reference numerals.

In all the sections that follow, the directional orientations indicated such as "upper/top", "lower/bottom", "up", "down", "left", "right", "vertical", "horizontal", "transverse" and "longitudinal" etc, correspond to those of a motor vehicle in the mounted state.

The holder 1 according to the invention, shown in perspective view in FIG. 1 is capable of holding mobile devices having different dimensions.

In the example illustrated in FIG. 1, the holder according to the invention holds a Smartphone 2 represented in the figure by its exterior contour, in the "portrait" position.

Such a holder 1 is intended to be mounted on the dashboard of a motor vehicle (not shown), for example, in the proximity of the driver, or on another surface in the vehicle cabin. It is to be noted that such a holder may also be used in other areas apart from the automotive industry.

The holder 1 comprises a plate, of generally rectangular shape, defining the front face 4 of the holder 1, oriented to face the occupants of the vehicle when the holder 1 is mounted on the dashboard.

In the embodiment illustrated in the figures, the large dimensioned surface of the holder 1 is substantially vertical.

The holder 1 is preferably mounted centred relative to the dashboard of the motor vehicle (not shown) and substantially above the central console (not shown) in a manner so as to be accessible by the driver and the front passenger in the vehicle.

The holder 1 comprises a fixed upper jaw 6, arranged on the top edge of the front face 4. The upper jaw is curved downward towards the bottom, over its entire width, in a manner so as to define a hook or beak 7, projecting out from the front face 4. In the example represented in the figures, the fixed upper jaw 6 is formed from the top edge of the front face 4. In another embodiment (not shown), the fixed upper jaw 6 is attached on to the top edge of the front face 4. The opening of the beak 7 is determined so as to be capable of receiving and holding the top edge of the Smartphone 2 within a range of thicknesses compatible with Smart phones and other tablets available on the market.

The holder 1 includes a movable jaw 5, which is the lower jaw, mounted so as to be movable in translational motion on the holder 1, opposite the fixed jaw 6.

The movable jaw 5 comprises of a front portion 51 projecting out from the front face 4 and extending parallel to the bottom edge of the front face 4 The front portion 51 of the movable jaw 5 is integrally attached to two identical guide members 91 and 92 respectively extending the left and right extremities of the movable jaw 5, to the rear of the holder 1, while encircling the left and right, vertical lateral edges, of the holder 1.

The movable jaw 5 is thus borne slidably by the two guide members 91 and 92 along guide rails that are not represented.

Return means, not shown, are arranged in the upper part of the holder 1 and are coupled to the movable jaw 5, in a manner so as cause it to move in translational motion towards the fixed jaw 6 in the absence of biasing of the movable jaw 5.

The front portion of the movable jaw 51 defines a channel for receiving the bottom edge of the smartphone. The bottom 52 of the channel 51 is substantially flat.

The outer edge 53 of the channel 51 is curved upwards in a manner so as to define following a straight section, a beak 8 projecting out from the front face 4. The opening of the beak 8 relative to the front face 4, is determined such as to be able to receive and hold in place the bottom edge of the Smartphone 2 within a range of thicknesses compatible with Smartphones and other tablets available on the market.

The plate 3 and the movable jaw 5 are made out of materials suitable for injection molding, typically plastic material, for example thermoplastic material such as polyester, or homopolymer or copolymer polyolefin, or even for example, from PC+ABS (Polycarbonate and Acrylonitrile Butadiene Styrene); these materials may be reinforced by mineral fillers, or with natural or glass fibres. These materials have a rigidity that contributes the ability to perform a support function.

Moreover, the movable jaw 5 is, by way of a variant or optionally, at least partially covered by a coating of elastomeric plastic material, for example an EPDM (Ethylene Propylene Diene Monomer).

In addition, the front face 4 is, by way of a variant or optionally, at least partially covered by a coating that gives it the lacquered or glossy appearance, for example with a varnish. This contributes to ensuring that the appearance has value and appeal for the passenger.

However, after repeated handling and manipulations, the risk of scratching the front face 4 of the holder 1 and/or the rear face 2A of the Smartphone 2 remains present, especially when the user sets in place the bottom edge of the Smartphone 2 in the receiving channel and presses on the Smartphone 2 in order to cause the lowering of the movable jaw 5 beyond the holding position.

With a view to reducing this risk, the inner edge 54 of the channel 51 is suitably shaped so as to have at least one protuberance defining a tab 55 that is integrally joined with the movable jaw 5 and that extends up against the front face 4 of the holder 1.

The tab 55 extends along a plane parallel to the front face 4 of the holder 1 and defines a clamping tab for clamping the bottom edge of the Smartphone 2 within the channel 51.

The thickness of the tab 55 is determined so as to be able to define a space "e" (FIG. 4) between the rear face 2A of the Smartphone 2 and the front face 4 of the holder 1 in order to limit the friction contact of the rear face 2A of the Smart phone 2 when the latter is mounted on the front face 4 of the holder 1.

Figure 4:
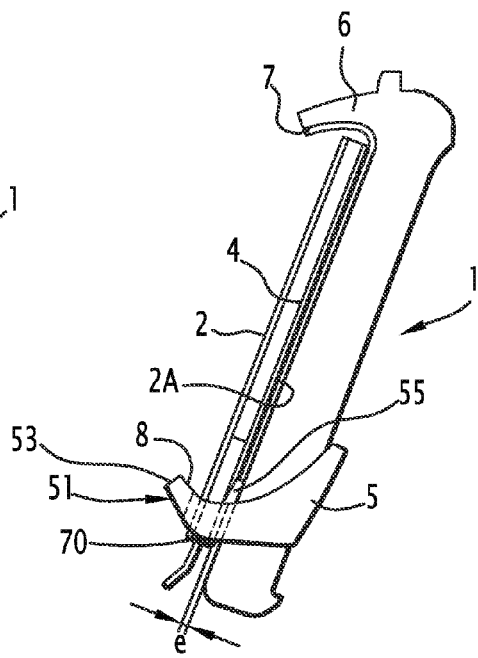

The shape and dimensions (height, width and thickness) of the tab are determined so as to ensure a maximum space between the bottom edge of the Smartphone 2 and the front face 4 of the holder 1 as well as a minimum space between the top edge of the Smartphone 2 and the front face 4 of the holder 1 (FIG. 4).

The tab 55 also participates in the guiding of the movable jaw 5 on the front face 4 of the holder 1 and in ensuring the rigidity of the assembly comprising of the front portion 51 and rear portions 91, 92 of the movable jaw 5 on the holder 1.

A shallow recess 40 of a few tenths of a millimeter depth is formed on the front face 4 of the holder 1 in a manner so as to define a groove. One portion of the inner face of the tab 55 cooperates with the groove 40 in order to ensure the guiding thereof on the front face 4.

The thickness of the tab 55 is thus determined in order to ensure both engaging the interior of the groove 40 and, defining the space 'e' with the front face 4.

Figure 5:
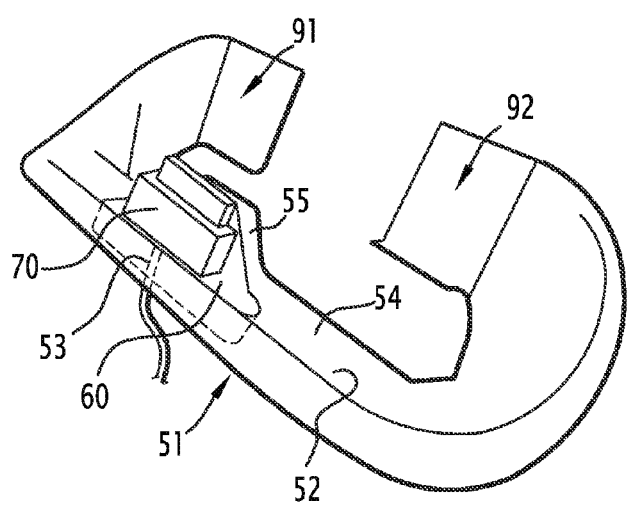
FIG. 5 illustrates the movable jaw of the holder with the clamping system receiving a connector.

The bottom 52 of the channel 51 advantageously includes an opening 60 of generally rectangular shape, passing right through the bottom 52 and centred along the axis of vertical symmetry ZZ' of the holder 1. Its dimensions are determined so as to allow for the through passage of a connector 70 (FIG. 5), for example for ensuring the supply of electrical power to the Smartphone 2 when it is held in place in the holder 1 (FIG. 4).

The front surface of the tab 55 is advantageously used as a guide face for the bottom edge of the Smartphone 2.

It is merged with a part of the internal wall of the opening 60.

Figure 3:
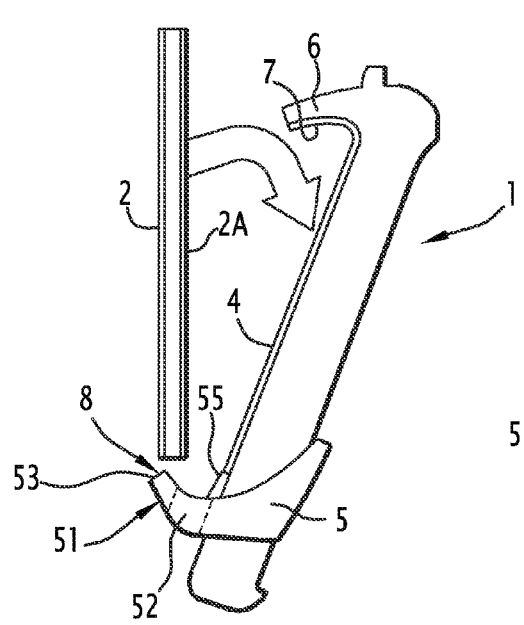
FIGS. 3 and 4 are two profile views of the holder respectively illustrating the steps of the Smartphone's approach as it comes to be in front of the clamping system according to the invention, and of finally holding the Smartphone in place on the clamping system according to the invention.

With reference to the FIG. 3, the user, using only one hand, brings the bottom edge of the Smartphone 2 to engage within the channel 51 against the front surface of the tab 55. Thus, the risk of friction caused by the Smartphone 2 rubbing against the front face 4 of the holder 1 is reduced and advantageously offers the ability to avoid the creation of scratches on the front face 4 of the holder 1 and/or on the rear face 2A of the Smartphone 2.

Then, the user by means of a tilting movement that tips the Smartphone 2 towards the front face 4 of the holder 1, brings about the contacting of the upper rear portion of the Smartphone 2 against the front face 4 of the holder 1, while continuing to maintain the downward pressure applied in order to insert the top edge of the Smartphone 2 into the interior of the beak 7 of the fixed jaw 6.

The user then progressively releases the pressure on the movable jaw 5, which naturally rises up towards the fixed jaw 6 under the effect of the return means.

The protuberance 55 prevents direct contact between an edge of the device and the front face 4 of the holder 1, in particular while bringing about engagement of the device into the movable jaw 5 and as it is moved away from the fixed jaw 6.

Figure 6:
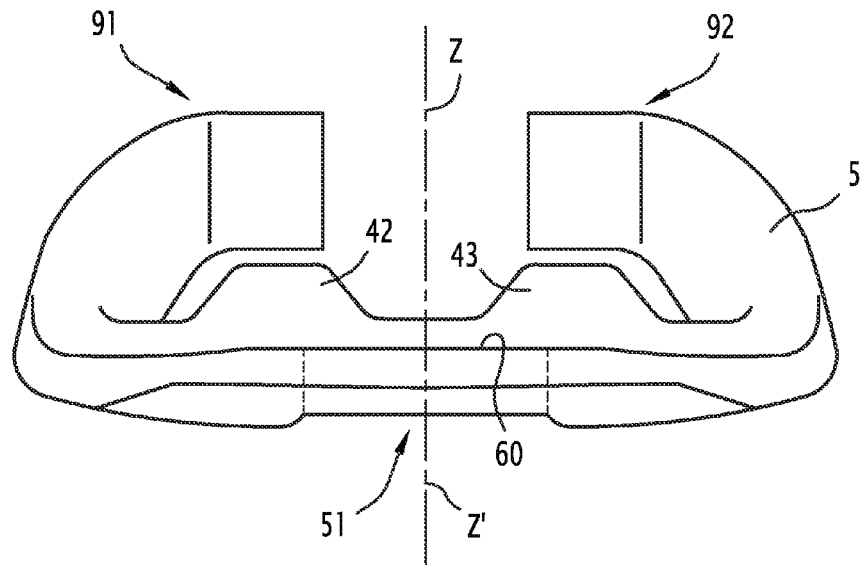
FIGS. 6 and 7 respectively illustrate by way of front views, two variant embodiments of implementation of a clamping system according to the invention.
Figure 7:
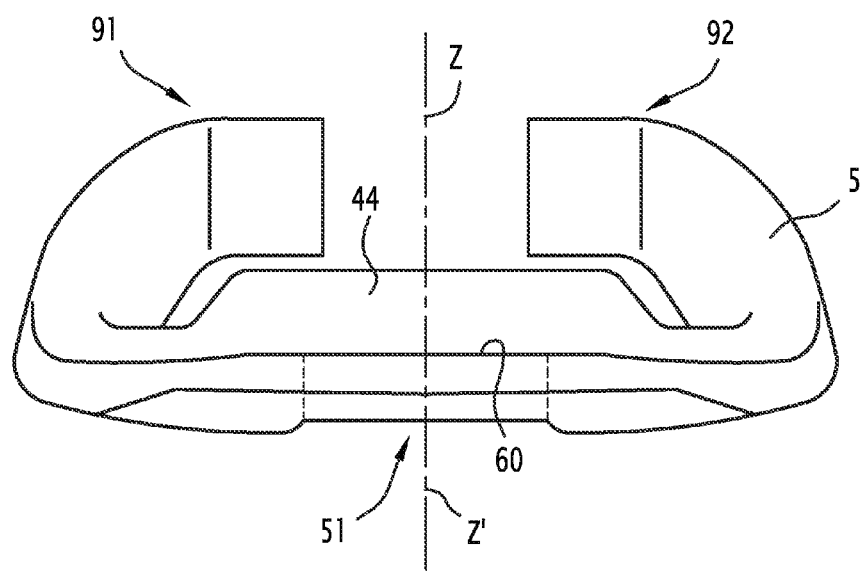

Various different configurations of the tab 55 and the number thereof, may be considered and certain amongst them have been illustrated in the FIGS. 6 and 7.

According to the FIG. 6, two identical tabs 42 and 43 are formed symmetrically on either side of the vertical symmetry axis ZZ' of the holder 1. According to the FIG. 7, the movable jaw 5 includes one single tab 44 of a large width, occupying substantially the entire width distance of the movable jaw 5.

The present invention provides the ability to handle and manipulate the mobile device on the movable jaw in a safe and secure manner without damaging the holder or the mobile device.

The invention claimed is:

1. A holder for a mobile device, comprising a front face bearing a fixed jaw that is integrally attached to the holder, the holder further comprising a movable jaw, positioned facing the fixed jaw, mounted to be movable in translational motion on the front face of the holder, wherein the movable jaw is adapted to receive a first edge of the mobile device, between a released position, wherein the first edge of the mobile device is placed against the movable jaw, and a holding position in which a second edge of the mobile device, opposite the first is held clamped against the fixed jaw, the movable jaw comprising at least one protuberance extending along a plane parallel to the front face of the holder and capable of defining a clamping tab for clamping the first edge of the mobile device, the shape and the dimensions of the tab being appropriately established so as to extend between the rear face of the mobile device and the front face of the holder when the moveable jaw is in the holding position such that contact between the rear face of the mobile device and the front face of the holder adjacent the first edge of the mobile device is prevented and a determined space is defined between the rear face of the mobile device and the front face of the holder;

wherein the protuberance has one portion arranged in a groove formed on the front face of the holder and is movable in translational motion along the groove.

2. A holder according to claim 1, wherein the clamping tab is formed in one piece of material with the movable jaw.

3. A holder according to claim 1, wherein a front portion of the movable jaw projecting out from the front face has an opening whose dimensions are determined so as to allow for the through passage of a connector of the mobile device when the first lateral edge of the mobile device is positioned against the clamping tab.

4. A holder according to claim 3, wherein the opening is of a generally rectangular shape, passing right through the front portion of the movable jaw and centered along an axis of vertical symmetry of the holder, the front surface of the tab being at least partially merged with a part of the wall of the opening.

5. A holder according to claim 1, wherein a front surface of the tab defines a guide surface capable of guiding the first lateral edge of the mobile device.

6. A holder according to claim 1, wherein the movable jaw is the lower jaw when considering the holder oriented in its position of use, the movable jaw being capable of cooperating with a bottom edge of the mobile device.

7. A dashboard of a motor vehicle, comprising a holder according to claim 1.

8. A holder according to claim 1, wherein a front portion of the movable jaw projecting out from the front face has an opening of a generally rectangular shape, passing right through the front portion of the movable jaw and centered along an axis of vertical symmetry of the holder, the front surface of the tab being at least partially merged with a part of the wall of the opening.

9. A holder according to claim 1, wherein the front surface is defined entirely by the fixed jaw.

10. A holder according to claim 1, wherein the protuberance extends along the plane parallel to the front face of the holder from an end of the front surface and along the front surface, thereby blocking at least a portion of the front surface of the holder from contacting the rear face of the mobile device when the movable jaw is in the holding position.

11. A holder according to claim 1, wherein the protuberance is positioned such that the rear face of the mobile device is prevented from contacting the front surface of the holder when the first edge is inserted into the moveable jaw and before an end of the mobile device opposite the first edge is placed into the fixed jaw.

12. A holder according to claim 11, wherein the protuberance is defined by the movable jaw.

13. A holder according to claim 1, wherein when the moveable jaw is in the holding position, the protuberance spaces the rear face of the mobile device adjacent the first edge away from the front surface of the holder such that the rear face of the mobile device is positioned at a non-parallel angle with respect to the front surface of the holder.

14. A holder according to claim 13, wherein the fixed jaw is configured to secure an end of the mobile device opposite the first edge against the front surface of the holder.

* * * * *